United States Patent
Guo et al.

(10) Patent No.: US 12,334,932 B2
(45) Date of Patent: Jun. 17, 2025

(54) EYE EXPANDER FOR PAM4 SIGNAL LINEARIZATION

(71) Applicant: TEXAS INSTRUMENTS INCORPORATED, Dallas, TX (US)

(72) Inventors: Shita Guo, Dallas, TX (US); Amit S. Rane, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/587,095

(22) Filed: Jan. 28, 2022

(65) Prior Publication Data
US 2023/0246636 A1    Aug. 3, 2023

(51) Int. Cl.
*H03K 5/12*    (2006.01)
*H03K 5/02*    (2006.01)
*H03K 5/1252*    (2006.01)
*H03K 17/56*    (2006.01)

(52) U.S. Cl.
CPC ............. *H03K 5/1252* (2013.01); *H03K 5/02* (2013.01); *H03K 17/56* (2013.01)

(58) Field of Classification Search
CPC ...... H03F 1/3211; H03F 3/45; H03F 3/45076; H03F 3/4508; H03F 3/45085; H03F 2203/45138
USPC .................................................. 327/560–563
See application file for complete search history.

(56) References Cited

U.S. PATENT DOCUMENTS

| | | | | |
|---|---|---|---|---|
| 5,903,185 | A * | 5/1999 | Cargill | H03F 1/3211 330/252 |
| 6,545,502 | B1 * | 4/2003 | Dasgupta | H03F 3/45089 327/382 |
| 6,552,612 | B1 * | 4/2003 | Wilson | H03F 3/45183 330/254 |
| 8,493,149 | B2 * | 7/2013 | Parikh | H03F 3/45197 330/254 |
| 9,025,654 | B1 * | 5/2015 | Su | H04L 25/03057 375/233 |
| 9,136,797 | B2 * | 9/2015 | Huang | H03F 1/3211 |
| 9,882,532 | B1 * | 1/2018 | Vera Villarroel | H03F 3/45098 |
| 10,833,643 | B1 * | 11/2020 | Broekaert | H03G 3/3068 |
| 10,924,307 | B1 * | 2/2021 | Zhang | H03K 17/60 |
| 11,231,736 | B2 * | 1/2022 | Kim | G05F 3/00 |
| 2005/0110569 | A1 * | 5/2005 | Bhattacharjee | H03F 3/45183 330/254 |

(Continued)

*Primary Examiner* — Quan Tra
(74) *Attorney, Agent, or Firm* — Mandy Barsilai Fernandez; Frank D. Cimino

(57) ABSTRACT

An eye expander that increases the transmitter linearity of Pulse-Amplitude Modulation 4-Level (PAM4) signals having an inner eye and two outer eyes. In embodiments, the eye expander includes a semi-linear gain stage that increases the eye height of the outer eyes. In some of those embodiments, the semi-linear gain stage includes a semi-linear gain input transistor having a base or gate coupled to an input terminal and a collector or drain coupled to an output terminal, a semi-linear gain resistor coupled to the emitter or source of the semi-linear gain input transistor, and semi-linear gain transistor-resistor pairs that selectively connect the emitter or source of the semi-linear gain input transistor to ground. In some embodiments, the eye expander includes a limiting gain stage that reduces the eye height of the inner eye and a linear gain stage that increases the eye height of the inner and outer eyes.

12 Claims, 6 Drawing Sheets

(56) References Cited

U.S. PATENT DOCUMENTS

2015/0008982 A1* 1/2015 Huang .................. H03F 1/3241
  29/600
2019/0312759 A1* 10/2019 Chen ....................... H04L 25/49
2021/0167739 A1* 6/2021 Hu .......................... H03F 3/211

* cited by examiner

EYE EXPANDER FOR PAM4 SIGNAL LINEARIZATION

BACKGROUND

Transmission of data or other signals through a medium (such as a wire, an optical cable or over the air) may result in the degradation of the data due to a number of factors (such as, propagation delays, noise and/or interference). Eye diagrams can be used to check the quality of a transmitted signal. Transmitted signals with wide, clear openings ("eyes") are less degraded and less susceptible to bit errors. Pulse-amplitude modulation (PAM) is used to transmit signals via coaxial cable, fiber optic cable, ethernet cable, printed circuit board (PCB) traces, etc. The Pulse-Amplitude Modulation 4-Level (PAM4) coding scheme provides high throughput by using four voltage levels that each represent a combination of two bits. The four voltage levels of the PAM4 coding scheme causes PAM4-encoded signals to form three eyes: an inner eye and two outer eyes.

To provide a high signal-to-noise ratio and comply with the relevant pulse-amplitude modulation specification, PAM4-encoded signals must be sufficiently linear, meaning the three eyes must have similar eye heights. However, circuit non-linearity often causes PAM4-encoded signals to have an inner eye with a larger eye height than the eye heights of the two outer eyes.

To increase transmitter linearity of PAM4-encoded signals, prior art eye expanders reduce the eye height of the inner eye while maintaining the eye height of the outer eyes. In doing so, however, the prior art eye expanders reduce the total eye height of the PAM4-encoded signal, thereby reducing the signal-to-noise ratio of the PAM4-encoded signal and degrading the bit rate error of the system.

SUMMARY

An eye expander operable to increase the transmitter linearity of Pulse-Amplitude Modulation 4-Level (PAM4) signals having three eyes including an inner eye and two outer eyes. In embodiments, the eye expander includes a semi-linear gain stage that increases the eye height of the outer eyes. In embodiments, the semi-linear gain stage includes a semi-linear gain input transistor having a base or gate coupled to an input terminal and a collector or drain coupled to an output terminal, a semi-linear gain resistor coupled to the emitter or source of the semi-linear gain input transistor, and a plurality of semi-linear gain transistor-resistor pairs that selectively connect the emitter or source of the semi-linear gain input transistor to ground. In some embodiments, the eye expander also includes a limiting gain stage that reduces the eye height of the inner eye and a linear gain stage that increases the eye height of the inner and outer eyes.

BRIEF DESCRIPTION OF THE DRAWINGS

For a detailed description of various examples, reference will now be made to the accompanying drawings in which.

The same reference numbers or other reference designators are used in the drawings to designate the same or similar (either by function and/or structure) features.

DETAILED DESCRIPTION

Figure 1A:
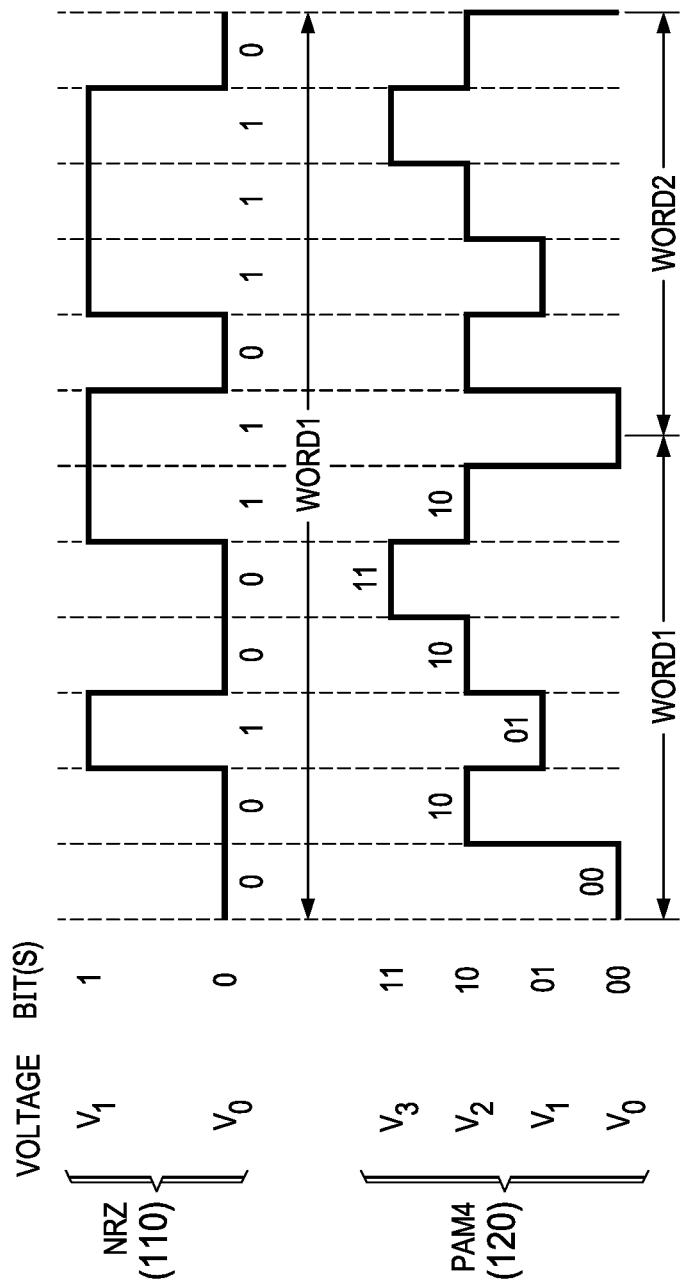
FIG. 1A illustrates the Non-Return to Zero (NRZ) and Pulse-Amplitude Modulation 4-Level (PAM4) pulse-amplitude modulation (PAM) coding schemes.

FIG. 1A illustrates two pulse-amplitude modulation (PAM) coding schemes: Non-Return to Zero (NRZ) 110 and Pulse-Amplitude Modulation 4-Level (PAM4) 120. NRZ 110, which is also known as Pulse-Amplitude Modulation 2-Level (PAM2), is a modulation technique wherein two voltage levels, $V_0$ and $V_1$, represent a logic 0 and a logic 1, respectively. PAM4 120 coding provides twice the throughput as NRZ coding for the same baud rate by using four voltage levels that each represent a combination of two bits. In the example of FIG. 1A, the voltage levels are mapped using linear coding, wherein voltage level $V_0$ represents the symbol 00, voltage level $V_1$ represents the symbol 01, voltage level $V_2$ represents the symbol 10, and voltage level $V_3$ represents the symbol 11. In other examples, the mapping method can use gray coding as shown in Table 1:

TABLE 1

| Voltage | Linear Coding | Gray Coding |
|---|---|---|
| $V_3$ | 11 | 10 |
| $V_2$ | 10 | 11 |
| $V_1$ | 01 | 01 |
| $V_0$ | 00 | 00 |

Figure 1B:
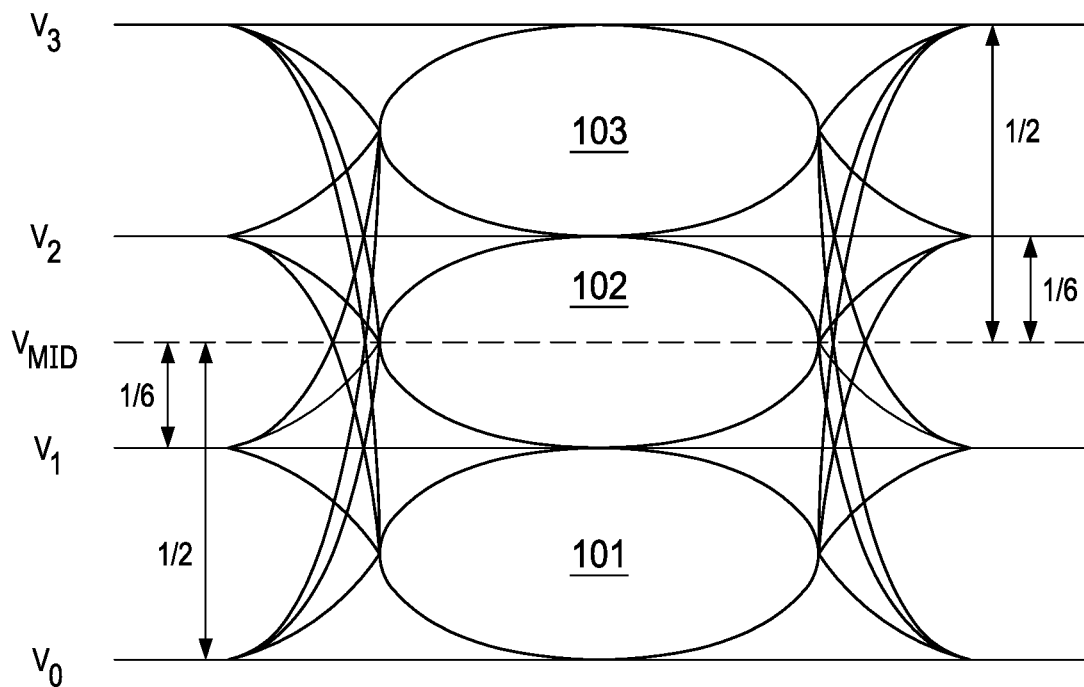
FIG. 1B is an eye diagram of a perfectly linear PAM4 signal.

FIG. 1B is an eye diagram of an example PAM4 signal. As shown in FIG. 1B, the four voltage levels of the PAM4 coding scheme causes PAM4 signals to form three eyes: an inner eye 102 between the mean signal level $V_1$ and the mean signal level $V_2$, a first outer eye 101 between the mean signal level $V_0$ and the mean signal level $V_1$, and a second outer eye 103 between the mean signal level $V_2$ and the mean signal level $V_3$.

Transmitter linearity is a measure of variance in amplitude separation between different PAM4 voltage levels. As discussed in more detail below, the PAM4 signal illustrated in FIG. 1B has perfect transmitter linearity $R_{LM}$, meaning all three of the eyes 101, 102, and 103 have equal height. The PAM4 specification requires a transmitter linearity $R_{LM}$ greater than 0.95. To calculate the transmitter linearity $R_{LM}$, the mid-range voltage level $V_{MID}$, which is half the distance between the voltage level $V_0$ and the voltage level $V_3$, is calculated as shown in equation 1:

$$V_{MID} = \frac{V_0 + V_3}{2} \tag{1}$$

Two "effective symbol" levels ES1 and ES1 are calculated as shown in equations 2 and 3:

$$ES1 = \frac{V_1 - V_{MID}}{V_0 - V_{MID}} \tag{2}$$

$$ES2 = \frac{V_2 - V_{MID}}{V_3 - V_{MID}} \tag{3}$$

And the transmitter linearity $R_{LM}$ is calculated as shown in equation 4:

$$R_{LM} = \min((3 \times ES1), (3 \times ES2), (2-3 \times ES1), (2-3 \times ES2)) \tag{4}$$

For instance, using the example signal of FIG. 1B, which has perfect transmitter linearity $R_{LM}$, the transmitter linearity $R_{LM}$ is calculated as follows:

$$ES1 = \frac{V_1 - V_{MID}}{V_0 - V_{MID}} = \frac{\frac{1}{6}}{\frac{1}{2}} = \frac{1}{3}$$

$$ES2 = \frac{V_2 - V_{MID}}{V_3 - V_{MID}} = \frac{\frac{1}{6}}{\frac{1}{2}} = \frac{1}{3}$$

$$R_{LM} = \min((3 \times ES1), (3 \times ES2), (2-3 \times ES1), (2-3 \times ES2))$$
$$= \min\left(\left(3 \times \frac{1}{3}\right), \left(3 \times \frac{1}{3}\right), \left(2-3 \times \frac{1}{3}\right), \left(2-3 \times \frac{1}{3}\right)\right)$$
$$= \min(1, 1, 1, 1)$$
$$= 1$$

Figure 1C:
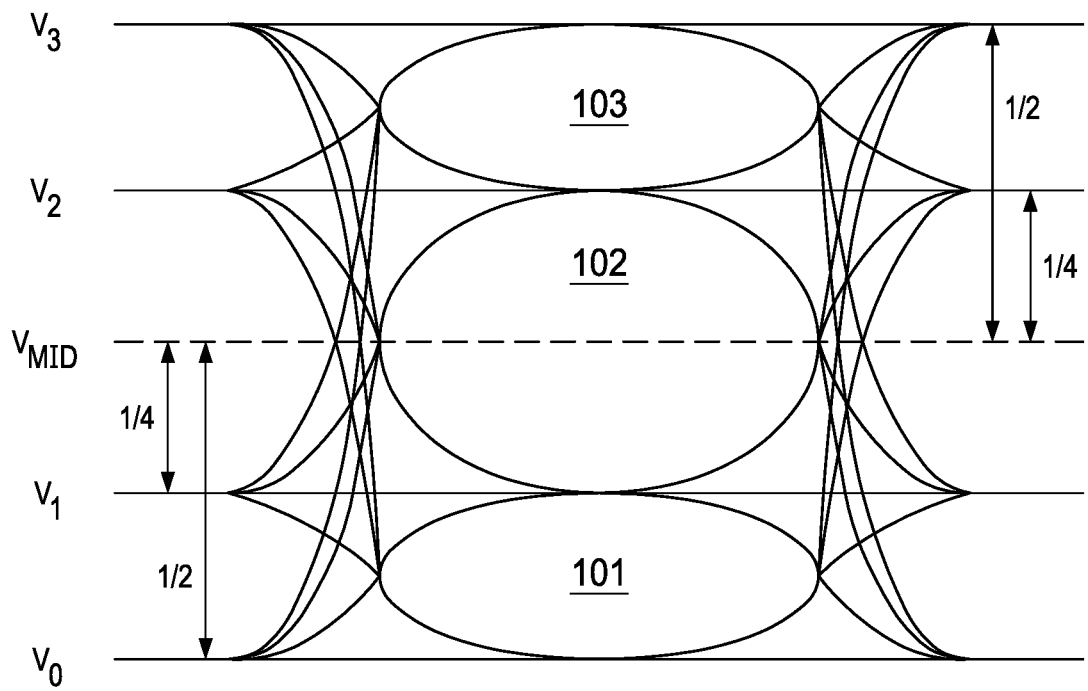
FIG. 1C is an eye diagram of a non-linear PAM4 signal.

The perfect transmitter linearity $R_{LM}$ is also shown graphically in FIG. 1B, as the differences between the mid-range voltage level $V_{MID}$ and both of the voltage levels $V_1$ and $V_2$ are ⅙ of the total eye height of the PAM4 signal of FIG. 1B, meaning the eye height of all three of the eyes 101, 102, and 103 of FIG. 1C are ⅓ of the total eye height of the PAM4 signal of FIG. 1C.

In many instances, however, circuit nonlinearity causes the eye height of the inner eye 102 to be larger than the eye height of the outer eyes 101 and 103, which degrades the signal-to-noise ratio of the PAM4 signal.

FIG. 1C is an eye diagram of a non-linear PAM4 signal. In the example of FIG. 1C, the eye height of the inner eye 102 is larger than the eye height of the outer eyes 101 and 103. Specifically the transmitter linearity $R_{LM}$ of the PAM4 signal of FIG. 1C is 0.5 because the differences between the mid-range voltage level $V_{MID}$ and both of the voltage levels $V_1$ and $V_2$ are ¼ of the total eye height of the PAM4 signal of FIG. 1C, meaning the eye height of the inner eye 102 is ½ of the total eye height of the PAM4 signal while the eye height of each outer eye 102 and 103 is ¼ of the total eye height of the PAM4 signal. Using equations 1-4 above, the transmitter linearity $R_{LM}$ of the example non-linear signal of FIG. 1C is calculated as follows:

$$ES1 = \frac{V_1 - V_{MID}}{V_0 - V_{MID}} = \frac{\frac{1}{4}}{\frac{1}{2}} = \frac{1}{2}$$

$$ES2 = \frac{V_2 - V_{MID}}{V_3 - V_{MID}} = \frac{\frac{1}{4}}{\frac{1}{2}} = \frac{1}{2}$$

$$R_{LM} = \min((3 \times ES1), (3 \times ES2), (2-3 \times ES1), (2-3 \times ES2))$$
$$= \min\left(\left(3 \times \frac{1}{2}\right), \left(3 \times \frac{1}{2}\right), \left(2-3 \times \frac{1}{2}\right), \left(2-3 \times \frac{1}{2}\right)\right)$$
$$= \min(1.5, 1.5, 0.5, 0.5)$$
$$= 0.5$$

To increase the transmitter linearity $R_{LM}$ of PAM4-encoded signals, prior art eye expanders reduce the eye height of the inner eye 102 while maintaining the eye height of the outer eyes 101 and 103.

Figure 2:
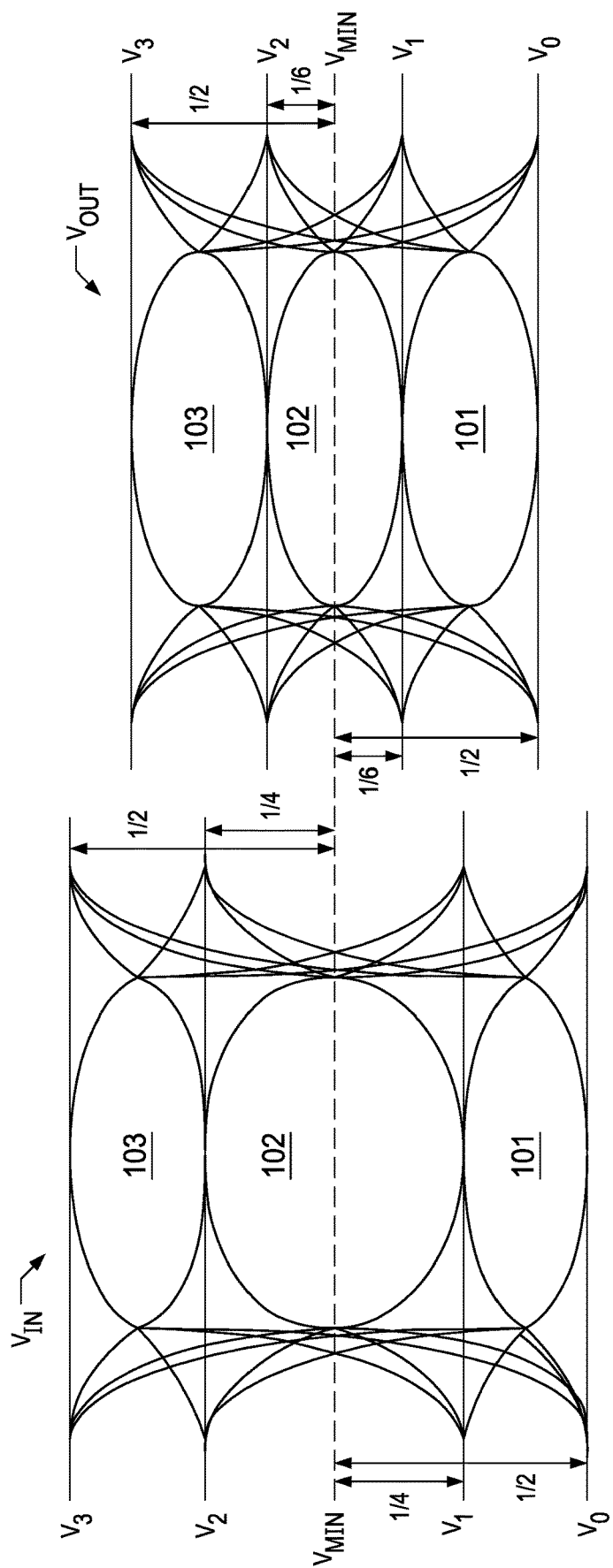
FIG. 2 are eye diagrams of an example non-linear input signal $V_{IN}$ and an example output signal $V_{OUT}$ generated by prior art eye expanders.

FIG. 2 is the eye diagram of a non-linear PAM4 input signal $V_{IN}$ having a transmitter linearity $R_{LM}$ of 0.5 and an output signal $V_{OUT}$, generated by a prior art eye expander (i.e., an eye expander that reduces the height of the inner eye 102 of the input signal $V_{IN}$). As shown in FIG. 2, the transmitter linearity $R_{LM}$ is increased from 0.5 to 1.0 by reducing the height of the inner eye 102 between the voltage level $V_1$ and the voltage level $V_2$. However, by reducing the eye height of the inner eye 102 while maintaining the eye height of the outer eyes 101 and 103, the total eye height of the input signal $V_{IN}$ is reduced, thereby reducing the signal-to-noise ratio (SNR) of the output signal $V_{OUT}$ and degrading the bit rate error (BER) of the system. Some of the example embodiments discussed below, increase transmitter linearity while maintaining sufficiently high SNR and BER.

Figure 3:
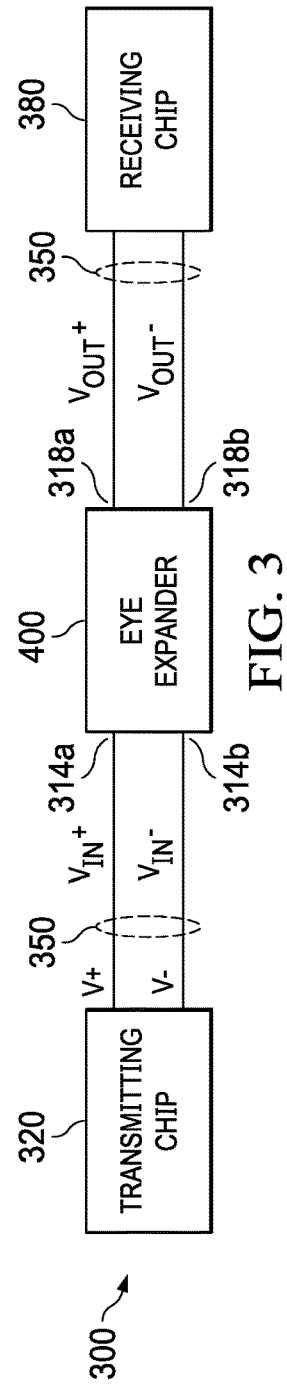
FIG. 3 is a block diagram of a system for transmitting pulse-amplitude modulated signals according to an illustrative embodiment.

FIG. 3 is a block diagram of a system 300 for transmitting PAM4-encoded signals according to an illustrative embodiment. In the embodiment of FIG. 3, a transmitter 320 outputs PAM4-encoded signals via a communications channel 350 for transmission to a receiving chip 380. In the embodiment of FIG. 3, the transmitting chip 320 outputs two differential signals, including a positive transmit signal V+ and a negative transmit signal V−. To increase the linearity of the PAM4-encoded signals, the system 300 includes the PAM4 eye expander 400, which is described in detail below with reference to FIG. 4. The PAM4 eye expander 400 includes a positive input terminal 314a, which receives the positive transmit signal V+ from the transmitting chip 320 (hereinafter referred to as the positive input signal $V_{IN}+$), and a negative input terminal 314b, which receives the negative transmit signal V− from the transmitting chip 320 (hereinafter referred to as the negative input signal $V_{IN}-$). Collectively, the positive input signal $V_{IN}+$ and the negative input signal $V_{IN}-$ form the differential input signal and are referred to as the input signal $V_{IN}$. As described in detail below with reference to FIGS. 5-6, the eye expander 400 compensates for non-linearity of the input signal $V_{IN}$ by equalizing the input signal $V_{IN}$ to form a positive output signal $V_{OUT}+$ and the negative output signal $V_{OUT}-$ (collectively, forming the differential output signal referred to as $V_{OUT}$). The eye expander 400 includes a positive output terminal 318a that outputs the positive output signal $V_{OUT}+$ and a negative output terminal 318b that outputs the negative output signal $V_{OUT}-$. Together, the positive output terminal 318a and the negative output terminal 318b output the differential output signal $V_{OUT}$ via the communications channel 350 for transmission to the receiving chip 380.

In various embodiments, the transmitting chip 320 and/or the receiving chip 380 may be any circuit (e.g., integrated circuit, microchip, etc.) suitably configured to send and/or receive pulse-amplitude modulated signals. The transmitting chip 320 and/or the receiving chip 380 may be implemented on/in a single integrated circuit, semiconductor die and/or semiconductor package. In various embodiments, the communications channel 350 may be any communications medium capable of receiving, carrying, and delivering pulse-amplitude modulated signals (e.g., coaxial cable, fiber optic cable, ethernet cable, printed circuit board (PCB) traces, etc.).

Figure 4:
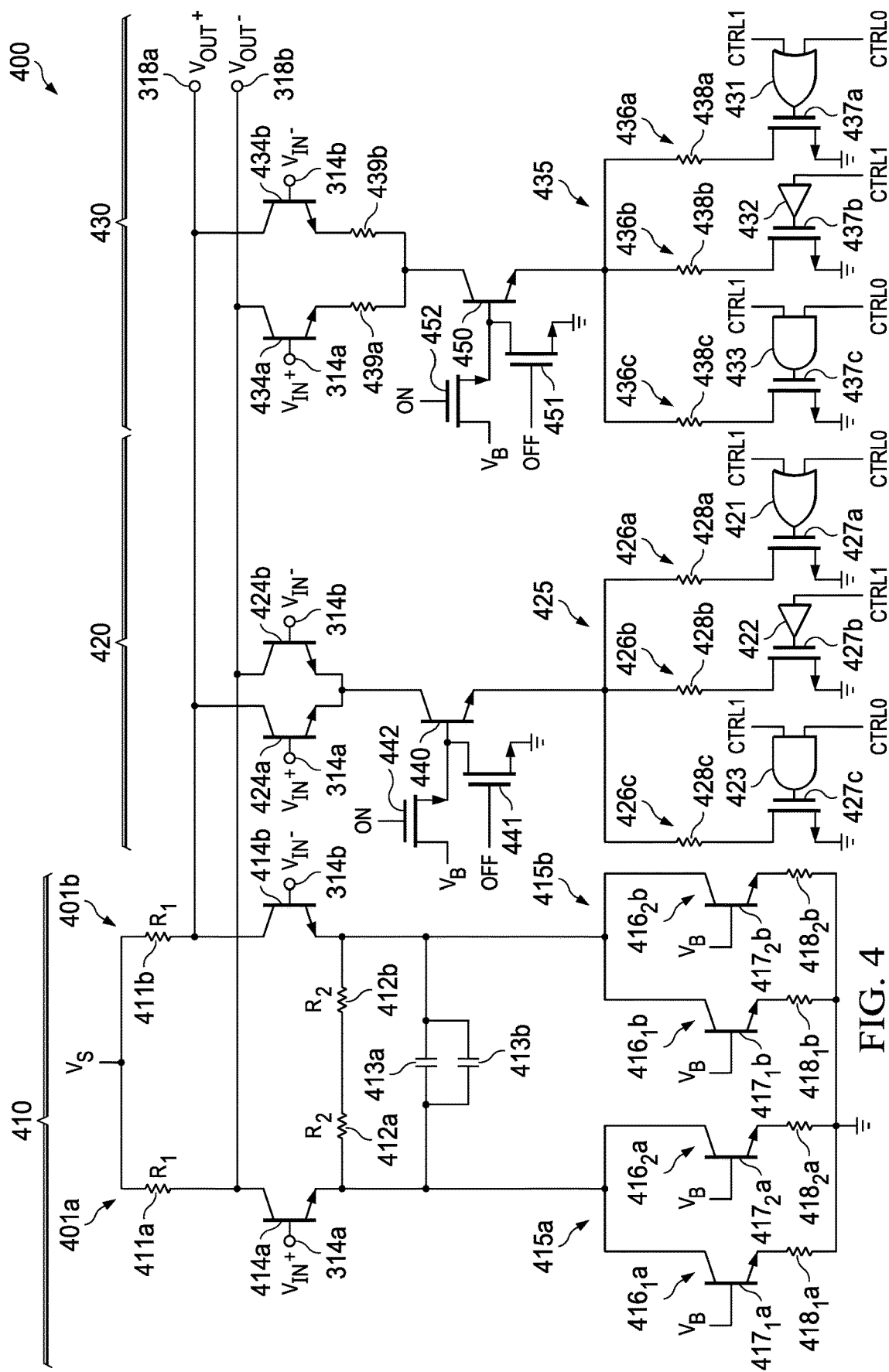
FIG. 4 is a schematic diagram of a PAM4 eye expander according to an illustrative embodiment, including a linear gain stage, a limiting gain stage, and a semi-linear gain stage.

FIG. 4 is a schematic diagram of a PAM4 eye expander 400 according to an exemplary embodiment. In the embodiment of FIG. 4, the PAM4 eye expander 400 includes a linear gain stage 410, a limiting gain stage 420, and a semi-linear gain stage 430. As described below with reference to FIG. 5A, the linear gain stage 410 amplifies all three eyes 101, 102, and 103 of the input signal $V_{IN}$. As described below with reference to FIG. 5B, the gain limiting stage 420 provides a negative gain in the inner eye 102 to compensate for the non-linearity of the input signal $V_{IN}$. Additionally, the semi-linear gain stage 430 provides a positive gain to the outer eyes 101 and 103.

In the embodiment of FIG. 4, the linear gain stage 410 includes two symmetrical resistor-capacitor (RC) circuits 401: a positive input RC circuit 401a and a negative input RC circuit 401b. The positive input RC circuit 401a includes a linear gain positive input transistor 414a, a first positive input resistor 411a having a first resistance $R_1$, a second positive input resistor 412a having a second resistance $R_2$, and a positive input capacitor 413a having a capacitance value of C. The negative input RC circuit 401b includes a linear gain negative input transistor 414b, a first negative input resistor 411b having the first resistance $R_1$, a second negative input resistor 412b having the second resistance $R_2$, and a negative input capacitor 413b having a capacitance value of C. The linear gain positive input transistor 414a and the linear gain negative input transistor 414b are individually and collectively referred to as linear gain input transistors 414. The first positive input resistor 411a and the first negative input resistor 411b are individually and collectively referred to as first resistors 411. The second positive input resistor 412a and the second negative input resistor 412b are individually and collectively referred to as second resistors 412. The positive input capacitor 413a and the negative input capacitor 413b are individually and collectively referred to as capacitors 413.

In the embodiment of FIG. 4, each linear gain input transistor 414 is a bipolar junction transistor that includes a base, a collector and an emitter. In other embodiments, each linear gain input transistor 414 may be a field effect transistor that includes a gate, a drain, and a source. The base of the linear gain positive input transistor 414a is coupled to the positive input terminal 314a and receives the positive input signal $V_{IN}$+ from the transmitting chip 320 of FIG. 3 via the communications channel 350 of FIG. 3. The base of the linear gain negative input transistor 414b is coupled to the negative input terminal 314b and receives the negative input signal $V_{IN}$− from the transmitting chip 320 via the communications channel 350. The collector of the linear gain positive input transistor 414a is also coupled to the negative output terminal 318b. The collector of the linear gain negative input transistor 214b is coupled to the positive output terminal 318a.

In the positive input RC circuit 401a, the collector of the linear positive gain input transistor 414a is also coupled to a source voltage Vs via the first positive input resistor 411a and the emitter of the linear gain positive input transistor 414a is coupled to the positive input capacitor 413a and the second positive input resistor 412a. In the negative input RC circuit 401b, the collector of the linear gain negative input transistor 414b is coupled to the source voltage $V_B$ via the first negative input resistor 411b and the emitter of linear gain negative input transistor 414b is coupled to the negative input capacitor 413b and the second negative input resistor 412b. The second resistors 412a and 412b are coupled in series between the emitters of each of the two linear gain input transistors 414. The capacitors 413a and 413b are coupled in parallel between the emitters of each of the linear gain input transistors 414a and 414b.

In each of the RC circuits 401, the first resistor 411 and the second resistor 412 provide a linear gain having a magnitude $R_1/R_2$ and the capacitor 413 provides a peaking gain at high frequencies. As one of ordinary skill in the art would recognize, in other embodiments, the second resistors 412a and 412b coupled in series may be realized as a single resistor. Similarly, the capacitors 413a and 413b coupled in parallel may be realized as a single capacitor.

The emitter of the linear gain positive input transistor 414a is also coupled to a bias current source 415a and the emitter of the linear gain negative input transistor 414b is coupled to a bias current source 415b. The bias current sources 415a and 415b are individually and collectively referred to as bias current source 415 or bias current sources 415. In the embodiment of FIG. 4, the bias current source 415a provides a bias current to the RC circuit 401a by coupling the emitter of the linear gain positive input transistor 414a to ground via two bias current source resistor-transistor pairs $416_1a$ and $416_2a$ in parallel. The bias current source 415b provides a bias current to the RC circuit 401b by coupling the emitter of the linear gain negative input transistor 414b to ground via two bias current source resistor-transistor pairs $416_1b$ and $416_2b$ in parallel. The bias current source resistor-transistor pairs $416_1a$, $416_2a$, $4161b$, and $4162b$ are individually and collectively referred to as bias current source resistor-transistor pairs 416. In other embodiments, each bias current source 415a and 415b may include any number of bias current source resistor-transistor pairs 416.

In the embodiment of FIG. 4, each bias current source resistor-transistor pair 416 includes a bias current source transistor 417 coupled in series with a bias current source resistor 418. In the specific embodiment of FIG. 4, the bias current source resistor-transistor pair $416_1a$ includes the bias current source transistor $417_1a$ coupled in series with the bias current source resistor $418_1a$, the bias current source resistor-transistor pair $416_2a$ includes the bias current source transistor $417_2a$ coupled in series with the bias current source resistor $418_2a$, the bias current source resistor-transistor pair $416_1b$ includes the bias current source transistor $417_1b$ coupled in series with the bias current source resistor $418_1b$, and the bias current source resistor-transistor pair $416_2b$ includes the bias current source transistor $417_2b$ coupled in series with the bias current source resistor $418_2b$. In the embodiment of FIG. 4, each bias current source transistor 417 is a bipolar junction transistor. In other embodiments, the bias current source transistors 417 may be field effect transistors. To provide a bias current to each of the RC circuits 401a and 401b, the base of each of the bias current source transistors 417 receives a bias voltage $V_B$.

Figure 5A:
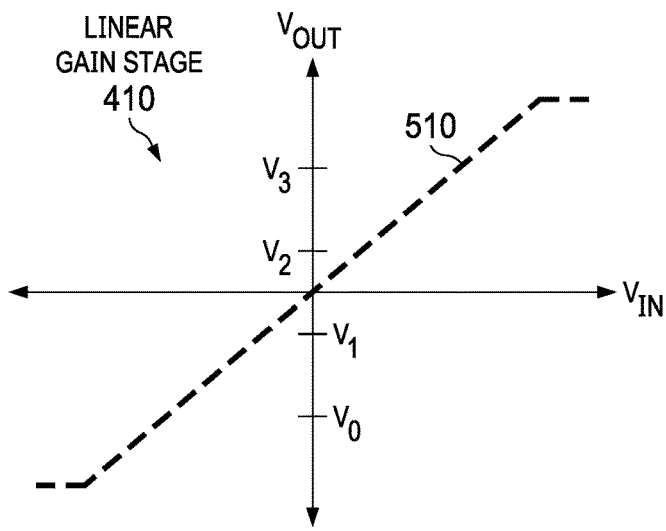
FIG. 5A is a graph of the voltage gain of the linear gain stage of the PAM4 eye expander of FIG. 4 according to an illustrative embodiment.

FIG. 5A is a graph 510 of the voltage response of the linear gain stage 410 according to an illustrative embodiment. The horizontal axis of FIG. 5A represents the instantaneous input voltage $V_{IN}$, which is equal to the difference between the instantaneous positive input voltage $V_{IN}+$ and the instantaneous negative input voltage $V_{IN}-$, and the vertical axis represents the instantaneous output voltage $V_{OUT}$, which is equal to the difference between the instantaneous positive output voltage $V_{OUT}+$ and the instantaneous negative output voltage $V_{OUT}-$. The voltage $V_{IN}$ and the output voltage $V_{OUT}$ are shown relative to the mid-range voltage level $V_{MID}$. Accordingly, as shown, the voltage levels $V_0$ and $V_1$ are negative and the voltage levels $V_2$ and $V_3$ are positive. However, the absolute voltages $V_0$ through $V_3$ may be positive or negative.

As shown in the graph 510 of FIG. 5A, the linear gain stage 410 provides linear amplification (having a magnitude equal to R1/R2) from the voltage level $V_0$ through the voltage level $V_3$. Accordingly, the linear gain stage 410 amplifies all three eyes 101, 102, and 103 of the PAM4 signal.

Referring back to the embodiment of FIG. 4, the limiting gain stage 420 includes a limiting gain positive input transistor 424a and a limiting gain negative input transistor 424b (individually and collectively referred to as limiting gain input transistors 424). In the embodiment of FIG. 4, the limiting gain input transistors 424 are bipolar junction transistors having a base, a collector, and an emitter. In other embodiments, the limiting gain input transistors 424 may be field effect transistors. The base of the limiting gain positive input transistor 424a is coupled to the positive input terminal 314a and receives the positive input signal $V_{IN}+$. The base of the limiting gain negative input transistor 424b is coupled to the negative input terminal 314b and receives the negative input signal $V_{IN}-$.

As described below with reference to FIG. 5B, the limiting gain stage 420 provides a negative gain (e.g., attenuation) to the inner eye 102 between the voltage level $V_1$ and the voltage level $V_2$. To provide that negative gain, the collector of the limiting gain positive input transistor 424a is coupled to the positive output terminal 318a and the collector of the limiting gain negative input transistor 424b is coupled to the negative output terminal 318b.

The emitter of each limiting gain input transistors 424 is coupled to ground via a limiting gain switch 440 and a limiting gain resistor network 425. The limiting gain switch 440 allows the limiting gain stage 420 to be turned off and on. In the embodiment of FIG. 4, the limiting gain switch 440 is a bipolar junction transistor with a gate coupled to ground via a limiting gain disabling transistor 441 and coupled to a bias voltage (e.g., the bias voltage $V_B$) via a limiting gain enabling transistor 442. In the embodiment of FIG. 4, the limiting gain disabling transistor 441 and the limiting gain enabling transistor 442 are field effect transistors. In other embodiments, the limiting gain switch 440 may be a field effect transistor, the limiting gain disabling transistor 441 may be bipolar junction transistor, and/or the limiting gain enabling transistor 442 may be bipolar junction transistor.

In response to an ON signal provided to the gate of the limiting gain enabling transistor 442, the limiting gain enabling transistor 442 provides the bias voltage $V_B$ to the base of the limiting gain switch 440, causing the limiting gain switch 440 to connect the emitters of the limiting gain input transistors 424 to the limiting gain resistor network 425. In response to an OFF signal provided to the gate of the limiting gain disabling transistor 441, the limiting gain disabling transistor 441 connects the gate of the limiting gain switch 440 to ground, causing the limiting gain switch 440 to disconnect the emitters of the limiting gain input transistors 424 from the limiting gain resistor network 425.

In embodiment of FIG. 4, the limiting gain resistor network 425 includes three limiting gain resistor-transistor pairs 426a, 426b, and 426c (individually and collectively referred to as limiting gain resistor-transistor pairs 426). In other embodiments, the limiting gain resistor network 425 may have any number of resistor-transistor pairs 426. Each limiting gain resistor-transistor pair 426 couples the emitters of the limiting gain input transistors 424 to ground in parallel. In the specific embodiment of FIG. 4, the first limiting gain resistor-transistor pair 426a includes a first limiting gain resistor network transistor 427a, which selectively connects the emitters of the limiting gain input transistors 424 to ground via a first limiting gain resistor 428a; the second limiting gain resistor-transistor pair 426b includes a second limiting gain resistor network transistor 427b, which selectively connects the emitters of the limiting gain input transistors 424 to ground via a second limiting gain resistor 428b; and the third limiting gain resistor-transistor pair 426c includes a third limiting gain resistor network transistor 427c, which selectively connects the emitters of the limiting gain input transistors 424 to ground via a third limiting gain resistor 428c. The limiting gain resistor network transistors 427a, 427b, and 427c are individually and collectively referred to as limiting gain resistor network transistors 427. The limiting gain resistors 428a, 428b, and 428c are individually and collectively referred to as limiting gain resistors 428. In the embodiment of FIG. 4, the limiting gain resistor network transistors 427 are field effect transistors having a gate, a drain, and a source. In other embodiments, the limiting gain resistor network transistors 427 may be bipolar junction transistors.

Collectively, the limiting gain resistor network transistors 427 are controlled by two digital control signals CTRL1 and CTRL0 that, together, form a two digit binary digital control signal (where CTRL1 is the most significant bit and CTRL0 is the least significant bit). The gate of the first limiting gain resistor network transistor 427a is coupled to the output of a limiting gain OR gate 421. The limiting gain OR gate 421 includes a first input that receives the control signal CTRL0 and a second input that receives the control signal CTRL1. The gate of the second limiting gain resistor network transistor 427b receives the control signal CTRL1, either directly or through a buffer 422. The gate of the third limiting gain resistor network transistor 427c is coupled to the output of a limiting gain AND gate 423. The limiting gain AND gate 423 includes a first input that receives the control signal CTRL0 and a second input that receives the control signal CTRL1. In the embodiment of FIG. 4, the digital control signal CTRL1 is provided to the gate of the second limiting gain resistor network transistor 427b via a limiting gain buffer 422 to ensure that the digital control signal CTRL1 is sufficient to drive the limiting gain resistor network transistor 427b. In other embodiments, the output of the limiting gain OR gate 421 may be coupled to the first limiting gain resistor network transistor 427a via a buffer and/or the output of the limiting gain AND gate 423 may be coupled to the third limiting gain resistor network transistor 427c via a buffer.

The limiting gain resistor network 425 enables the effective resistance between the emitters of the limiting gain input transistors 424 and ground to be adjusted dynamically using the control signals CTRL1 and CTRL0. In the embodiment of FIG. 4, each of the limiting gain resistors 428 has an identical resistance R, meaning the effective resistance of the limiting gain resistor network 425 can be any of four levels.

TABLE 2

| CTRL1, CTRL0 | AND Gate 423 Transistor 427c | CTRL1 Transistor 427b | OR Gate 421 Transistor 427a | Effective Resistance |
|---|---|---|---|---|
| 00 | OFF | OFF | OFF | Open Circuit |
| 01 | OFF | OFF | ON | R |
| 10 | OFF | ON | ON | R/2 |
| 11 | ON | ON | ON | R/3 |

As shown in Table 2 above, if the control signals CTRL0 and CTRL1 are both a logic 0, none of the limiting gain resistor network transistors 427 are turned on and the limiting gain resistor network 425 forms an open circuit. If the control signal CTRL1 is a logic 0 and the control signal CTRL0 is a logic 1, the limiting gain OR gate 421 turns on the first limiting gain resistor network transistor 427a, which connects the emitters of the limiting gain input transistors 424 to ground via the first limiting gain resistor 428a (while the second and third limiting gain resistor network transistors 427b and 427c remain off). If the control signal CTRL1 is a logic 1 and the control signal CTRL0 is a logic 0, the limiting gain OR gate 261 turns on the first limiting gain resistor network transistor 427a and the control signal CTRL1 turns on the second limiting gain resistor network transistor 427b, which connect the emitters of the limiting gain input transistors 424 to ground via the first and second limiting gain resistors 428a and 428b in parallel (while the third limiting gain resistor network transistor 427c remains off). Finally, if both the control signals CTRL1 and CTRL0 are logic 1, the limiting gain OR gate 421 turns on the first limiting gain resistor network transistor 427a (connecting the emitters of the limiting gain input transistors 424 to ground via the first limiting gain resistor 428a), the control signal CTRL1 turns on the second limiting gain resistor network transistor 427b (adding the second limiting gain resistor 428b in parallel with the first limiting gain resistor 428a between the emitters of the limiting gain input transistors 424 and ground), and the semi-linear gain AND gate 363 turns on (adding the third limiting gain resistor 428c in parallel with the first and second limiting gain resistors 428a and 428b between the emitters of the limiting gain input transistors 424 and ground).

Adjusting the effective resistance of the limiting gain resistor network 425 changes the magnitude of the gain of the limiting gain stage 420. Accordingly, the limiting gain resistor network 425 enables the limiting gain stage 420 to be adjusted, using the control signals CTRL0 and CTRL1, to provide the gain required to compensate for the non-linearity of the input signals $V_{IN}+$ and $V_{IN}-$.

Figure 5B:
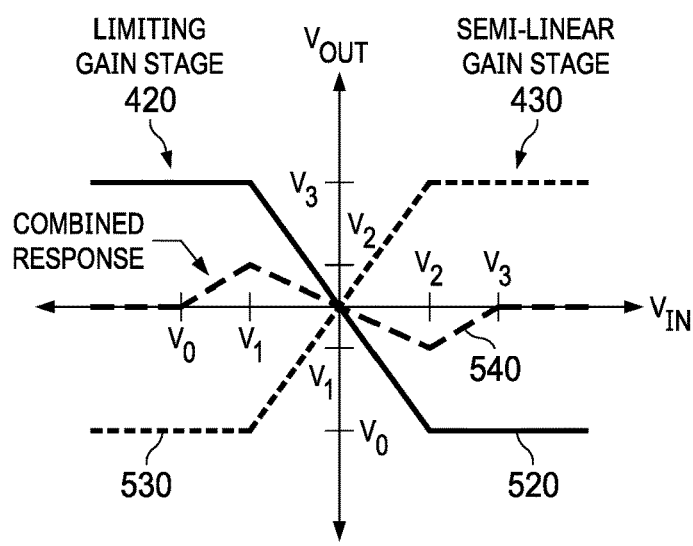
FIG. 5B is a graph of the voltage gain of the limiting gain stage and the semi-linear gain stage of the PAM4 eye expander of FIG. 4 according to an illustrative embodiment.

FIG. 5B is a graph that includes the voltage response of the limiting gain stage 420 (graph 520) of the PAM4 eye expander 400 according to an illustrative embodiment, where the horizontal axis represents the instantaneous input voltage $V_{IN}$, which is equal to the difference between the instantaneous positive input voltage $V_{IN}+$ and the instantaneous negative input voltage $V_{IN}-$, and the vertical axis represents the instantaneous output voltage $V_{OUT}$, which is equal to the difference between the instantaneous positive output voltage $V_{OUT}+$ and the instantaneous negative output voltage $V_{OUT}-$.

As shown in FIG. 5B, the limiting gain stage 420 provides a negative gain for an input voltage $V_{IN}$ between the voltage level $V_1$ and the voltage level $V_2$, thereby reducing the eye height of the middle eye 102 relative to the outer eyes 101 and 103 and increasing the transmitter linearity $R_{LM}$ of the PAM4 signal. However, as described above with reference to FIG. 2, reducing the eye height of the inner eye 102 while maintaining the eye height of the outer eyes 101 and 103 reduces the total eye height of the input signal $V_{IN}$, which reduces the signal-to-noise ratio of the output signal $V_{OUT}$ and degrades the bit rate error of the system 300. Accordingly, referring back to FIG. 4, the PAM4 eye expander 400 also includes a semi-linear gain stage.

In the embodiment of FIG. 4, the semi-linear gain stage 430 has a nearly identical structure as the limiting gain stage 420, except that the semi-linear gain stage 430 includes two semi-linear gain resistors 439 and provides a positive gain (by coupling the positive input terminal 314a to the negative output terminal 318b and coupling the negative input terminal 314b to the positive output terminal 318b). As described below with reference to FIG. 5B, the semi-linear gain resistors 439 enable the semi-linear gain stage 430 to provide a positive gain in the outer eyes 101 and 103 of the input signal $V_{IN}$. Accordingly, as described below with reference to FIGS. 5C and 6, the PAM4 eye expander 400 increases the transmitter linearity $R_{LM}$ of the input signal $V_{IN}$ while maintaining the total eye height of the input signal $V_{IN}$ by reducing the eye height of the inner eye 102 while increasing the eye height of outer eyes 101 and 103.

In the embodiment of FIG. 4, the semi-linear gain stage 430 includes a semi-linear gain positive input transistor 434a and a semi-linear gain negative input transistor 434b (individually and collectively referred to as semi-linear gain input transistors 434). In the embodiment of FIG. 4, the semi-linear gain input transistors 434 are bipolar junction transistors having a base, a collector, and an emitter. In other embodiments, the semi-linear gain input transistors 434 may be field effect transistors. The base of the semi-linear gain positive input transistor 434a is coupled to the positive input terminal 314a and receives the positive input signal $V_{IN}+$. The base of the semi-linear gain negative input transistor 434b is coupled to the negative input terminal 314b and receives the negative input signal $V_{IN}-$. As briefly mentioned above, to provide a positive gain, the collector of the semi-linear gain positive input transistor 434a is coupled to the negative output terminal 318b, which outputs the negative output signal $V_{OUT}-$, and the collector of the semi-linear gain negative input transistor 434b is coupled to the positive output terminal 318a, which outputs the positive output signal $V_{OUT}+$.

In the embodiment of FIG. 4, the emitter of the semi-linear gain positive input transistor 434a is coupled to ground via a semi-linear gain positive resistor 439a, a semi-linear gain switch 450, and a semi-linear gain resistor network 435. The emitter of the semi-linear gain negative input transistor 434b is coupled to ground via a semi-linear gain negative resistor 439b, the semi-linear gain switch 450, and the semi-linear gain resistor network 435. The semi-linear gain positive resistor 439a and the semi-linear gain negative resistor 439b are individually and collectively referred to as semi-linear gain resistors 439. As briefly mentioned above, the semi-linear gain resistors 439 enable the semi-linear gain stage 430 to provide a positive gain in the outer eyes 101 and 103. In the embodiment of FIG. 4, the semi-linear gain resistors 439 have the same resistance. In some embodiments, each of the semi-linear gain resistors 439a and 439b has a resistance of about 1 kiloohm (1 kΩ).

In other embodiments, the semi-linear gain resistors 439 may each have a resistance that is greater than or less than about 1 kΩ.

The semi-linear gain switch 450 allows the semi-linear gain stage 430 to be turned off and on. In the embodiment of FIG. 4, the semi-linear gain switch 450 is a bipolar junction transistor with a base coupled to ground via a semi-linear gain disabling transistor 451 and coupled to a bias voltage (e.g., the bias voltage $V_B$) via a semi-linear gain enabling transistor 452. In the embodiment of FIG. 4, the semi-linear gain disabling transistor 451 and the semi-linear gain enabling transistor 452 are field effect transistors. In other embodiments, the semi-linear gain switch 450 may be a field effect transistor, the semi-linear gain disabling transistor 451 may be bipolar junction transistor, and/or the semi-linear gain enabling transistor 452 may be bipolar junction transistor.

In response to an ON signal provided to the gate of the semi-linear gain enabling transistor 452, the semi-linear gain enabling transistor 452 provides the bias voltage $V_B$ to the base of the semi-linear gain switch 450, causing the semi-linear gain switch 450 to connect the emitters of the semi-linear gain input transistors 434 to the semi-linear gain resistor network 435 via semi-linear gain resistors 439. In response to an OFF signal provided to the gate of the semi-linear gain disabling transistor 451, the semi-linear gain disabling transistor 451 connects the base of the semi-linear gain switch 450 to ground, causing the semi-linear gain switch 450 to disconnect the emitters of the semi-linear gain input transistors 434 from the semi-linear gain resistor network 435.

In embodiment of FIG. 4, the semi-linear gain resistor network 435 includes three semi-linear gain resistor-transistor pairs 436a, 436b, and 436c (individually and collectively referred to as semi-linear gain resistor-transistor pairs 436). In other embodiments, the semi-linear gain resistor network 435 may have any number of semi-linear gain resistor-transistor pairs 436. Each semi-linear gain resistor-transistor pair 436 is operable to couple the emitters of the semi-linear gain input transistors 434 to ground in parallel. In the embodiment of FIG. 4, the first semi-linear gain resistor-transistor pair 436a includes a first semi-linear gain resistor network transistor 437a, which selectively connects the emitters of the semi-linear gain input transistors 434 to ground via a first semi-linear gain resistor network resistor 438a; the second semi-linear gain resistor-transistor pair 436b includes a second semi-linear gain resistor network transistor 437b, which selectively connects the emitters of the semi-linear gain input transistors 434 to ground via a second semi-linear gain resistor network resistor 438b; and the third semi-linear gain resistor-transistor pair 436c includes a third semi-linear gain resistor network transistor 437c, which selectively connects the emitters of the semi-linear gain input transistors 434 to ground via a third semi-linear gain resistor network resistor 438c. The semi-linear gain resistor network transistors 437a, 437b, and 437c are individually and collectively referred to as semi-linear gain resistor network transistors 437. The semi-linear gain resistor network resistors 438a, 438b, and 438c are individually and collectively referred to as semi-linear gain resistor network resistors 438. In the embodiment of FIG. 4, the semi-linear gain resistor network transistors 437 are field effect transistors having a gate, a drain, and a source. In other embodiments, the semi-linear gain resistor network transistors 437 may be bipolar junction transistors.

In the embodiment of FIG. 4, the semi-linear gain resistor network transistors 437 are also controlled by the digital control signals CTRL1 and CTRL0 that control the limiting gain resistor network transistors 427. The gate of the first semi-linear gain resistor network transistor 437a is coupled to the output of a semi-linear gain OR gate 431. The semi-linear gain OR gate 431 includes a first input that receives the control signal CTRL0 and a second input that receives the control signal CTRL1. The gate of the second semi-linear gain resistor network transistor 437b receives the control signal CTRL1, either directly or through a buffer 432. The gate of the third semi-linear gain resistor network transistor 437c is coupled to the output of a semi-linear gain AND gate 433. The semi-linear gain AND gate 433 includes a first input that receives the control signal CTRL0 and a second input that receives the control signal CTRL1. In the embodiment of FIG. 4, the digital control signal CTRL1 is provided to the gate of the second semi-linear gain resistor network transistor 437b via a semi-linear gain buffer 432 to ensure that the digital control signal CTRL1 is sufficient to drive the second limiting gain resistor network transistor 437b. In other embodiments, the output of the semi-linear gain OR gate 431 may be coupled to the first semi-linear gain resistor network transistor 437a via a buffer and/or the output of the semi-linear gain AND gate 433 may be coupled to the third semi-linear gain resistor network transistor 437c via a buffer.

The semi-linear gain resistor network 425 enables the effective resistance between the emitters of the limiting gain input transistors 434 and ground to be adjusted dynamically using the control signals CTRL1 and CTRL0. In the embodiment of FIG. 4, each of the semi-linear gain resistor network resistors 438 has an identical resistance R, meaning the effective resistance of the semi-linear gain resistor network 435 can be any of four levels.

TABLE 3

| CTRL1, CTRL0 | AND Gate 433 Transistor 437c | CTRL1 Transistor 437b | OR Gate 431 Transistor 437a | Effective Resistance |
|---|---|---|---|---|
| 00 | OFF | OFF | OFF | Open Circuit |
| 01 | OFF | OFF | ON | R |
| 10 | OFF | ON | ON | R/2 |
| 11 | ON | ON | ON | R/3 |

As shown in Table 3 above, if the control signals CTRL0 and CTRL1 are both a logic 0, none of the semi-linear gain resistor network transistors 437 are turned on and the semi-linear gain resistor network 435 forms an open circuit. If the control signal CTRL1 is a logic 0 and the control signal CTRL0 is a logic 1, the semi-linear gain OR gate 431 turns on the first semi-linear gain resistor network transistor 437a, which connects the emitters of the semi-linear gain input transistors 434 to ground via the first semi-linear gain resistor network resistor 438a (while the second and third semi-linear gain resistor network transistors 437b and 427c remain off). If the control signal CTRL1 is a logic 1 and the control signal CTRL0 is a logic 0, the semi-linear gain OR gate 361 turns on the first semi-linear gain resistor network transistor 437a and the control signal CTRL1 turns on the second semi-linear gain resistor network transistor 437b, which connect the emitters of the semi-linear gain input transistors 434 to ground via the first and second semi-linear gain resistor network resistors 438a and 438b in parallel (while the third semi-linear gain resistor network transistor 437c remains off). Finally, if both the control signals CTRL1 and CTRL0 are logic 1, the semi-linear gain OR gate 431 turns on the first semi-linear gain resistor network transistor 437a (connecting the emitters of the semi-linear gain input transistors 434 to ground via the first semi-linear gain resistor network resistor 438a), the control signal CTRL1 turns on the second semi-linear gain resistor network transistor 437b (adding the second semi-linear gain resistor network resistor 438b in parallel with the first semi-linear gain resistor network resistor 438a between the emitters of the semi-linear gain input transistors 434 and ground), and the semi-linear gain AND gate 433 turns on (adding the third semi-linear gain resistor network resistor 438c in parallel with the first and second semi-linear gain resistor network resistors 438a and 438b between the emitters of the semi-linear gain input transistors 434 and ground).

Adjusting the effective resistance of the semi-linear gain resistor network 435 changes the magnitude of the gain of the semi-linear gain stage 430. Accordingly, the semi-linear gain resistor network 435 enables the semi-linear gain stage 430 to be adjusted, using the control signals CTRL0 and CTRL1, to provide the gain required to compensate for the non-linearity of the input signals $V_{IN}+$ and $V_{IN}-$.

Referring again to FIG. 5B, the limiting gain stage 420 provides a negative gain (graph 520) for an input voltage $V_{IN}$ between the voltage level $V_1$ and the voltage level $V_2$. Meanwhile, the semi-linear gain stage 430 provides a positive gain (graph 530) for an input voltage $V_{IN}$ between the voltage level $V_0$ and the voltage level $V_3$. Accordingly, the combined response (graph 540) of the limiting gain stage 420 and the semi-linear gain stage 430 is a positive gain to the outer eye 101 of the input signal $V_{IN}$, a negative gain to the inner eye 102 of the input signal $V_{IN}$, and a positive gain to the outer eye 103 of the input signal $V_{IN}$.

Figure 5C:
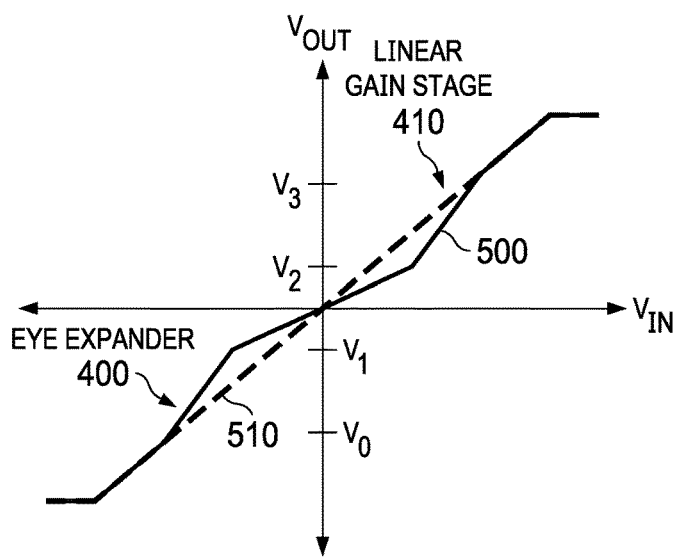
FIG. 5C is a graph of voltage gain of the PAM4 eye expander of FIG. 4 according to an illustrative embodiment.

FIG. 5C is a graph 500 of the voltage gain of the PAM4 eye expander 400 according to an illustrative embodiment, where the horizontal axis represents the instantaneous input voltage $V_{IN}$, which is equal to the difference between the instantaneous positive input voltage $V_{IN}+$ and the instantaneous negative input voltage $V_{IN}-$, and the vertical axis represents the instantaneous output voltage $V_{OUT}$, which is equal to the difference between the instantaneous positive output voltage $V_{OUT}+$ and the instantaneous negative output voltage $V_{OUT}-$.

As shown in FIG. 5C, the PAM4 eye expander 400 reduces the eye height of the inner eye 102 (between the voltage level $V_1$ and the voltage level $V_2$) while increasing the eye height of the outer eye 101 (between the voltage level $V_0$ and the voltage level Vi) and the outer eye 103 (between the voltage level $V_2$ and the voltage level $V_3$).

Figure 6:
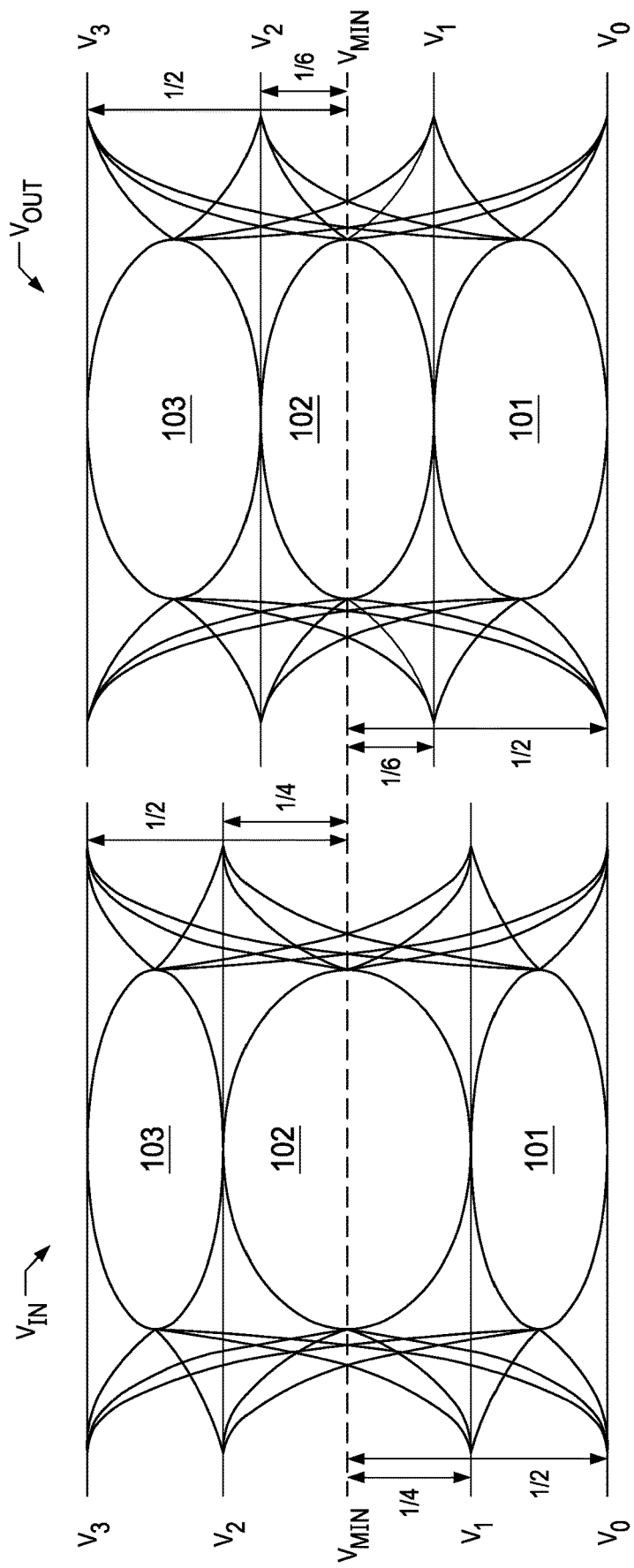
FIG. 6 are eye diagrams of an example non-linear input signal $V_{IN}$ and an output signal $V_{OUT}$ generated by the PAM4 eye expander of FIG. 4 according to an illustrative embodiment.

FIG. 6 are eye diagrams of an example non-linear input signal $V_{IN}$ and an output signal $V_{OUT}$ generated by the PAM4 eye expander 400 according to an illustrative embodiment.

As shown in FIG. 6, the PAM4 eye expander 400 increases the transmitter linearity $R_{LM}$ of the input signal $V_{IN}$ from 0.5 to 1.0 by reducing the height of the inner eye 102 (between the voltage level $V_1$ and the voltage level $V_2$) and increasing the eye height of the outer eye 101 (between the voltage level $V_0$ and the voltage level $V_1$) and the outer eye 103 (between the voltage level $V_2$ and the voltage level $V_3$). By reducing the reducing the height of the inner eye 102 and increasing the eye height of the outer eyes 101 and 103, the PAM4 eye expander 400 increases the transmitter linearity $R_{LM}$ of the input signal $V_{IN}$ while maintaining the total eye height of the input signal $V_{IN}$.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminal of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While some example embodiments of suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. An eye expander comprising:
    a first input terminal;
    a second input terminal;
    a first output terminal;
    a second output terminal;
    a first gain stage further including:
        a first transistor coupled to the first output terminal and to the first input terminal; and
        a second transistor coupled to the second output terminal and to the second input terminal;
        one or more primary resistor-transistor pairs coupled to the first transistor and the second transistor, each primary resistor-transistor pair configured to be coupled to a bias voltage terminal; and
    a second gain stage further including:
        a third transistor coupled to the second output terminal and to the first input terminal;
        a fourth transistor coupled to the first output terminal and to the second input terminal, and a current terminal of the fourth transistor is coupled to a current terminal of the third transistor at a first node;
        a first switch having a first terminal coupled to the first node and having a control terminal configured to be coupled to one of the bias voltage terminal and a ground terminal; and
        a plurality of first resistor-transistor pairs coupled in parallel between a second terminal of the first switch and the ground terminal, each operable to selectively couple the first node to the ground terminal responsive to a first control signal and a second control signal; and
    a third gain stage further including:
        a fifth transistor coupled to the first output terminal and to the first input terminal;
        a sixth transistor coupled to the second output terminal and to the second input terminal;
        a first resistor coupled between a current terminal of the fifth transistor and a second node;
        a second resistor coupled between a current terminal of the sixth transistor and the second node;
        a second switch having a first terminal coupled to the second node and having a control terminal configured to be coupled to one of the bias voltage terminal and the ground terminal; and
        a plurality of second resistor-transistor pairs coupled in parallel between a second terminal of the second switch and the ground terminal, each operable to selectively couple the second node to the ground terminal responsive to the first control signal and the second control signal.

2. The eye expander of claim 1, wherein the first input terminal receives a first input signal and the second input terminal receives a second input signal, an input signal includes the first input signal and the second input signal, the input signal is a Pulse-Amplitude Modulation 4-Level (PAM4) signal.

3. The eye expander of claim 1, wherein the first switch, in a first mode, configured to couple the first node to the plurality of first resistor-transistor pairs, and the first switch, in a second mode, configured to decouple the first node and the plurality of first resistor-transistor pairs.

4. The eye expander of claim 3, wherein each of the first resistor- transistor pair further comprises:
    a limiting resistor coupled to the first node; and
    a limiting transistor coupled between the limiting resistor and the ground terminal, the limiting transistor operable to selectively couple the first node to the ground terminal responsive to one or more control signals, the control signals including the first control signal and the second control signal.

5. The eye expander of claim 1, wherein the second switch, in a first mode, configured to couple the second node to the plurality of second resistor-transistor pairs, and the second switch, in a second mode, configured to decouple the second node and the plurality of second resistor-transistor pairs.

6. The eye expander of claim 5, wherein each of the second resistor- transistor pair further comprises:
    a semi-linear resistor coupled to the second node; and
    a semi-linear transistor coupled between the semi-linear resistor and the ground terminal, the semi-linear transistor operable to selectively couple the second node to the ground terminal responsive to one or more control signals, the control signals including the first control signal and the second control signal.

7. The eye expander of claim 2, wherein the second gain stage operable to provide a negative gain to an inner eye of the input signal, and the third gain stage configured to provide a positive gain to two outer eyes of the input signal.

8. The eye expander of claim 4, wherein the primary resistor-transistor pairs further comprises:
    a first set of bias current sources coupled to the first transistor; and
    a second set of bias current sources coupled to the second transistor.

9. The eye expander of claim 7, wherein the first gain stage operable to provide a positive gain to the inner eye and the two outer eyes of the input signal.

10. An eye expander comprising:
    a positive input terminal;
    a negative input terminal;
    a positive output terminal;
    a negative output terminal;
    a linear gain stage, including:

a linear gain positive input transistor having a first current terminal, a first control terminal coupled to the positive input terminal, and a second current terminal coupled to the negative output terminal;

a linear gain negative input transistor having third current terminal, a second control terminal coupled to the negative input terminal, and a fourth current terminal coupled to the positive output terminal;

a first positive input resistor coupled between the second current terminal and a source voltage;

a first negative input resistor coupled between the fourth current terminal and the source voltage;

a second resistor coupled between the first current terminal and the third current terminal; and one or more primary resistor-transistor pairs coupled to the first current terminal and the third current terminal, each primary resistor-transistor pair configured to be coupled to a bias voltage terminal;

a limiting gain stage, including:

a limiting gain positive input transistor having a fifth current terminal, a third control terminal coupled to the positive input terminal, and a sixth current terminal coupled to the positive output terminal;

a limiting gain negative input transistor having a seventh current terminal connected to the fifth current terminal, a fourth control terminal coupled to the negative input terminal, and an eighth current terminal coupled to the negative output terminal;

a first switch having a first terminal coupled to the seventh current terminal and having a control terminal configured to be coupled to one of the bias voltage terminal and a ground terminal; and a plurality of limiting gain transistor-resistor pairs, each coupled in parallel between a second terminal of the first switch and the ground terminal; and a semi-linear gain stage, comprising:

a semi-linear gain positive input transistor having a tenth current terminal coupled to a semi-linear gain positive resistor, a fifth control terminal coupled to the positive input terminal, and an eleventh current terminal coupled to the negative output terminal;

a semi-linear gain negative input transistor having a twelfth current terminal coupled to a semi-linear gain negative resistor, a sixth control terminal coupled to the negative input terminal, and a thirteenth current terminal coupled to the positive output terminal, the semi-linear gain positive resistor coupled to the semi-linear gain negative resistor at a second node;

a second switch having a first terminal coupled to the second node and having a control terminal configured to be coupled to one of the bias voltage terminal and the ground terminal; and a plurality of semi-linear gain transistor-resistor pairs, each coupled in parallel between the ground terminal and the second switch.

11. The eye expander of claim 10, wherein each of the semi-linear gain transistor-resistor pairs is operable to selectively connect the semi-linear gain positive resistor and the semi-linear gain negative resistor to the ground terminal in response to a control signal.

12. The eye expander of claim 11, wherein each of the limiting gain transistor-resistor pairs is operable to selectively connect the seventh current terminal and the fifth current terminal to the ground terminal in response to the control signal.

* * * * *